United States Patent
Li

(10) Patent No.: US 7,908,544 B2
(45) Date of Patent: Mar. 15, 2011

(54) EXTENDED CONVOLUTIONAL CODES

(75) Inventor: Pen Li, San Jose, CA (US)

(73) Assignee: NXP B.V., Eindhoven (NL)

( * ) Notice: Subject to any disclaimer, the term of this patent is extended or adjusted under 35 U.S.C. 154(b) by 1142 days.

(21) Appl. No.: 11/628,124

(22) PCT Filed: May 25, 2005

(86) PCT No.: PCT/IB2005/051714
§ 371 (c)(1),
(2), (4) Date: Nov. 28, 2006

(87) PCT Pub. No.: WO2005/117316
PCT Pub. Date: Dec. 8, 2005

(65) Prior Publication Data
US 2007/0250760 A1  Oct. 25, 2007

Related U.S. Application Data

(60) Provisional application No. 60/575,318, filed on May 28, 2004, provisional application No. 60/582,612, filed on Jun. 24, 2004.

(51) Int. Cl.
*H03M 13/03* (2006.01)
(52) U.S. Cl. .......................... 714/786; 714/808; 714/763
(58) Field of Classification Search .................. 714/786, 714/763, 808, 773, 758, 796
See application file for complete search history.

(56) References Cited

U.S. PATENT DOCUMENTS

| | | | |
|---|---|---|---|
| 4,534,040 A * | 8/1985 | Thapar | 375/261 |
| 4,980,897 A | 12/1990 | Decker et al. | |
| 5,612,974 A * | 3/1997 | Astrachan | 375/295 |
| 5,781,569 A * | 7/1998 | Fossorier et al. | 714/795 |
| 6,598,203 B1 * | 7/2003 | Tang | 714/790 |
| 2002/0051499 A1 * | 5/2002 | Cameron et al. | 375/295 |
| 2003/0101401 A1 | 5/2003 | Salvi et al. | |

(Continued)

FOREIGN PATENT DOCUMENTS
EP    1 075 088    2/2001

OTHER PUBLICATIONS

Morii, M. et al., "Improved Cedervell-Johannesson Algorithm for Computing the Distance Spectrum of Convolutional Codes", Electronics and Communications in Japan, part 3, vol. 79, No. 1, pp. 67-80 (1996); translated from Denshi Joho Tsushin Gakkai Ronbunshi, vol. 78-A, No. 3, pp. 416-426 (Mar. 1995).

(Continued)

*Primary Examiner* — Fritz Alphonse

(57) ABSTRACT

A system and method provides extended convolutional coding for packets/frames or superframes used in wireless transmission. A wireless system has an extended convolutional encoder/decoder, a wireless network, a server having an extended convolutional encoding/decoding module, one or more clients, at least one of which performs extended convolutional encoding/decoding; and a wireless transmission unit for the server and one or more clients to communicate via the wireless network. A method for providing the extended convolutional encoding includes the steps of retrieving a set of codes from a database that has a maximal-minimal free distance within a certain range; selecting a subset of the retrieved codes that have the smallest number of paths at the maximal-minimal free distance; and finding extended convolutional codes by selecting a code having a certain rate from the subset of codes that have the smallest number of paths at increased free distances to provide the best candidates. The performance of the extended code can be verified prior to encoding.

16 Claims, 4 Drawing Sheets

U.S. PATENT DOCUMENTS

2004/0213273 A1* 10/2004 Ma .............................. 370/401

OTHER PUBLICATIONS

Benedetto, S. et al. "Design of Parallel Concatenated Convolutional Codes", IEEE Trans. on Communications, vol. 44, No. 5, pp. 591-600 (May 1996).

Frenger, P. et al. "Combined Coding and Spreading in CDMA Systems Using Maximum Free Distance Convolutional Codes", IEEE 48th Vehicular Technology Conf., vol. 3, pp. 2497-2501 (1998).

Yeh, E. et al. "An FEC Overlay for Idle Slot Utilization for IS-136", IEEE 49th Vehicular Technology Conf., pp. 392-396 (1999).

Zhang, W. "Enhancement of Australian VHF Combat Net Radios", IEEE Military Communications Conf., vol. 1 of 2, Proc., Communications for Network-Centric Operations: Creating the Information Force, pp. 185-189 (2001).

Valenti, M. et al. "Distributed Turbo Codes: Towards the Capacity of the Relay Channel", IEEE 58th Conf. on Vehicular technology, vol. 1, pp. 322-326 (2003).

International Preliminary Report on Patentability for appln. No. PCT/IB2005/051714 (Nov. 29, 2006).

Lin, S. et al. "Error Control Coding: Fundamentals and Applications", cover, pp. i-iv, pp. 329-37 (1983).

* cited by examiner

EXTENDED CONVOLUTIONAL CODES

CROSS REFERENCE TO RELATED APPLICATION

This application claims the benefit of U.S. provisional application Ser. No. 60/575,318 filed May 28, 2004, and 60/582,612 filed Jun. 24, 2004 which is incorporated herein whole by reference.

FIELD

The invention relates to the field of error control coding for use in general communications, including but not limited to wire line, wireless, satellites, broadcasting, etc., and storage such as optical and magnetic, and many other fields. The present invention, in one particular aspect, relates to apparatuses and processes designed for use in wireless networks. More particularly, the present invention relates to techniques for modulation and coding, so that the data is protected to increase the coverage of a transmission system.

DESCRIPTION OF THE RELATED ART

In virtually all types of transmissions of data, coding is normally used to increase efficiency and provide error checking/error control.

Convolutional coding is a special case of error control-type coding. A quick review of convolutional coding reveals that in contrast with a block coder, which is a memory-less device, that uses fixed length blocks of information, a convolutional coder has a memory. In other words, the error coding performed in convolutional coding depends not only upon a set of input symbols being currently provided, but also takes into account some of the input symbols that were previously used and stored. The number of past information bits used is referred to as the constraint length. The more bits of past information (i.e. the higher is the value of a number representing the constraint length), the more efficient is the encoding. However, it is also true that as the number of bits of the constraint length increases, the more complex will be the decoder required for operation. Convolutional coding permits a fixed number of message symbols and permits an output of a fixed number of code symbols.

A convolutional encoder typically comprises modulo-2 adders and one or more delay elements. FIG. 1a is an example of such. There are three memory registers 102, 104 and 106. There is a first input bit Ui 108, and three output bits (v1, v2 and v3 from modulo-adders 110, 112 and 114). As the number of output bits n=3, and the number of input bits k=1 (Ui 108), and the number of memory registers m=3 (102, 104, 106), the (n, k, m) parameters are (3, 1, 3). The k/n rate (input/output) is thus a ⅓ code rate. That means that each one input bit is coded into three output bits. Finally, the constraint length (L) is 2 (as $U_o$ and $U_{-1}$), which are also identified by shading, hold the past information bits. Thus the constraint length=$2^L$, and in this case equals four ($2^2$). When the input is one bit (k=1) code rates such as ⅓, ¼, ⅕, ⅙ can sometimes be called mother codes. Such single bit codes can be combined to produce punctured codes. Punctured codes are those with code rates other than 1/n.

FIG. 1b illustrates one example of error control coding by Shu Lin. The encoder 101 shown takes k-bit input information sequence U 103 and produces an n-bit sequence, which is codeword v 105. Each encoded sequence v depends not only on the corresponding information u that is currently inputted, but also on m-1 previous message blocks (as the convolutional encoder has/accesses a memory). Hence, the encoder has a constraint length of m. In addition, a k-input, n-output encoder is also referred to as a rate k/n encoder, or a k-by-n matrix.

For example, a ½ rate encoder with generator of $133_8$ and $171_8$ and having a constraint length of 7 (shown in FIG. 1b) is depicted with the following bit values so that $133_8$ (1 011 011 in binary) and $171_8$ (1 110 001 in binary) shown in FIG. 1. The binary numbers representing $133_8$ and $171_8$ are shown in FIG. 1 as being arranged above and below the register memory boxes 107, respectively. The two binary values can be considered a first output and a second output, respectively, of the encoder.

Coding is used by many protocols, including but not limited to the IEEE 802.11 standard of wireless transmission that has become extremely popular.

However, there still exists a need to improve the convolutional coding, in particular for use with the wire line transmission, satellite, broadcast, optical, and other types of transmission. In addition, for example, new "superframes" are disclosed in Philips, N. A. disclosure 779763/4 that comprise a plurality of packets, but are backward-compatible to permit the continued use of existing legacy devices. As there are many standard codes previously published for different rates, these new superframes, as well as new systems, cannot adopt a complete new code due to the need for backward compatibility.

BRIEF SUMMARY

The instantly claimed invention provides a method, system and apparatus for providing extended convolutional codes wherein a new code having one or more higher rates, after puncturing, that is backward compatible because it is extended from that existing code. The new code bears the minimum bit error rate given the generators operating at the higher rate. In addition, in one aspect of the invention, an array of services in the physical layer that are tailored for a wireless environment are provided so as to increase the coverage. For example, multiple concurrent services are enabled for scenarios, such as transmitting video contents and remote control information simultaneously that can take full advantage of extended convolutional codes to extend their wireless system coverage.

BRIEF DESCRIPTION

FIGS. 1a and 1b provide illustrations of convolutional encoders.

FIG. 2 provides a flowchart overview of a method according to the present invention.

DETAILED DESCRIPTION

It is to be understood by persons of ordinary skill in the art that the following descriptions are provided for purposes of illustration, not for limitation. An artisan understands that there are many variations that lie within the spirit of the invention and the scope of the appended claims. Unnecessary details of known functions and operations may be omitted from the current description so as not to obscure the finer points of the present invention.

With regard to the present invention, according to the steps at least similar to those discussed in the flowchart, infra, the convolutional code is extended, which is heretofore unknown. For example, a ½ rate has 2 generators, and a ¼ rate has 4 generators. According to the present invention, for example, the code can be extended from 2 generators to 4 generators (or more, for example 2 generators to 50). It is to be stressed that the invention is not limited to a two generator to four generator extension, and covers extensions of any number to any larger number.

Figure 1A:
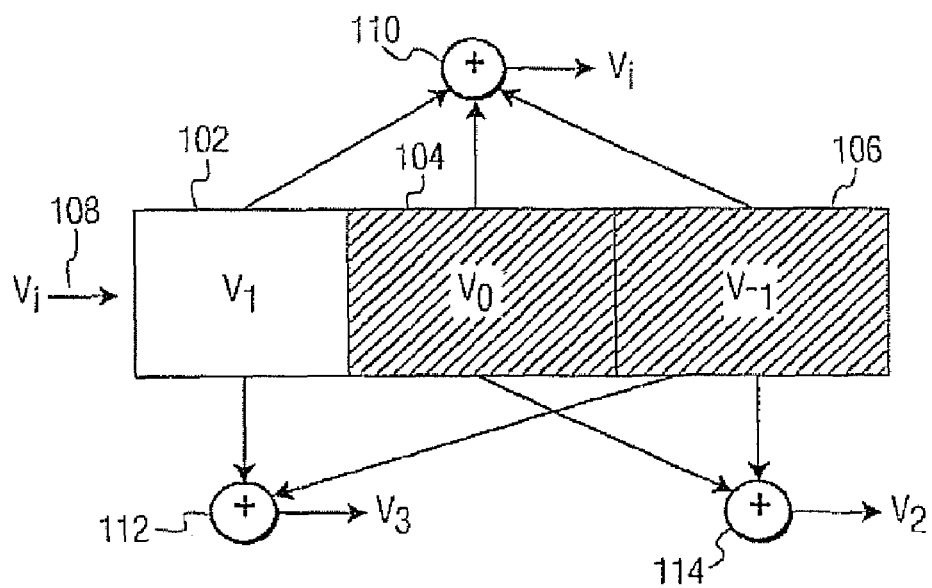
Figure 1B:
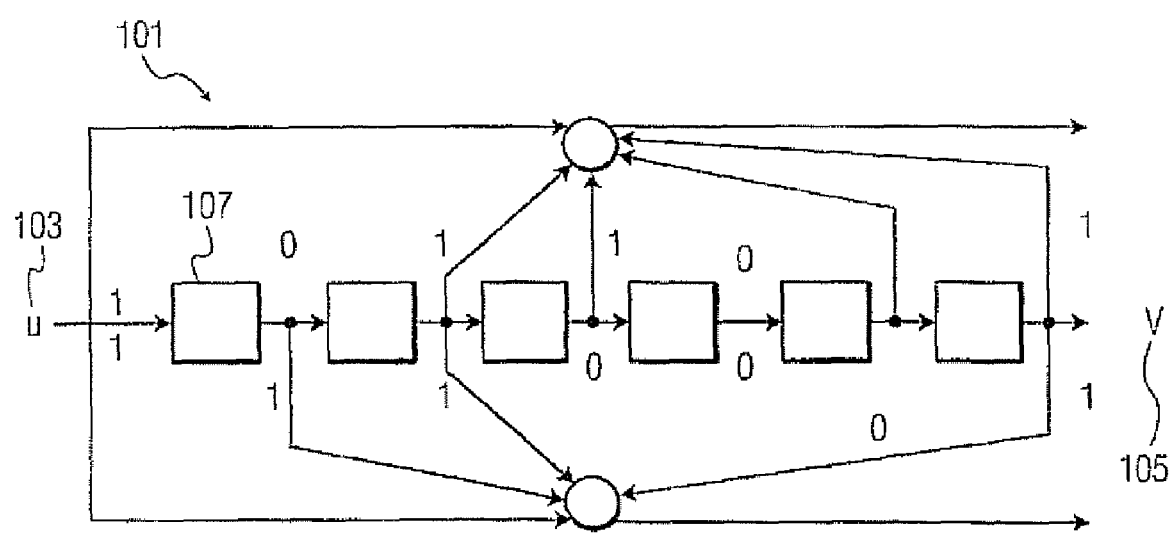
Figure 2:
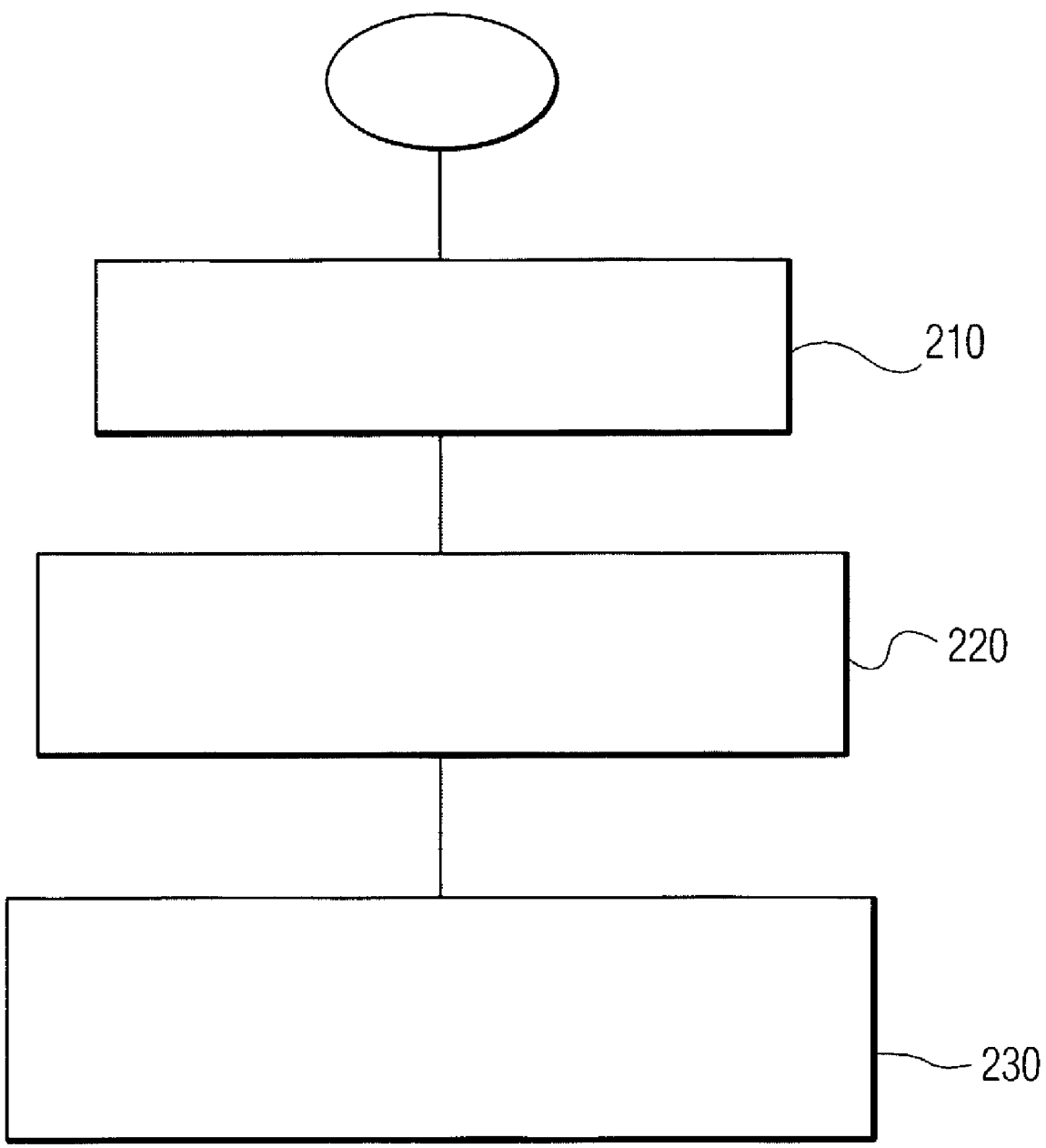

For further explanatory purposes, FIG. 2 provides a flowchart illustrating one way the present invention may operate, and in order to follow the method more closely, TABLE 1 provides the data from a simulation to extend the codes according to the present invention. Thus, the method begins with a ½ convolutional code rate (CCR) (133, 171) with a constraint length m=7 that is extended to find a new convolutional code CC having a ¼ CCR (133, 171, xxx, xxx). The convolution code rate refers to the data compression achieved over a fixed length code. In addition, Table 1, which includes a listing of all the codes found, including the BER performance at SNR=0 db of the best extended convolutional code (133, 171, 135, 175) as compared with the optimal code of a known system (135, 135, 147, 164) at index 85.

The BER@SNR error count means, for example, in the case of BER6.40e-5@104 that the simulation has collected 104 errors and is showing the bit error rate of 6.4e-5.

TABLE 1

Simulation Results

| INDEX | Generator (K = 7) | | | | # of paths w/ d_free = 20 at different trace length | | | | | # of paths @ different d_free | | | | | | | | | | | | | BER @ SNR = 0 dB (ber @ err cnt) |
|---|---|---|---|---|---|---|---|---|---|---|---|---|---|---|---|---|---|---|---|---|---|---|---|
| | | | | | 7 | 8 | 9 | 10 | 11 | 20 | 21 | 22 | 23 | 24 | 25 | 26 | 27 | 28 | 29 | 30 | 31 | 32 | |
| 1 | 133 | 171 | 135 | 175 | 0 | 1 | 3 | 5 | 7 | 16 | 22 | 3 | 7 | 2 | 0 | 3 | 1 | 0 | 1 | 2 | 0 | 0 | |
| 2 | 133 | 171 | 175 | 135 | 0 | 1 | 3 | 5 | 7 | 16 | 22 | 3 | 7 | 2 | 0 | 3 | 1 | 0 | 1 | 2 | 0 | 0 | |
| 3 | 133 | 171 | 127 | 175 | 0 | 1 | 3 | 5 | 7 | 16 | 24 | 0 | 2 | 6 | 3 | 3 | 2 | 0 | 0 | 1 | 0 | 0 | 6.40e-5 @ 104 |
| 4 | 133 | 171 | 137 | 165 | 0 | 1 | 3 | 5 | 7 | 16 | 24 | 0 | 2 | 6 | 3 | 3 | 2 | 0 | 0 | 1 | 0 | 0 | |
| 5 | 133 | 171 | 165 | 137 | 0 | 1 | 3 | 5 | 7 | 16 | 24 | 0 | 2 | 6 | 3 | 3 | 2 | 0 | 0 | 1 | 0 | 0 | |
| 6 | 133 | 171 | 175 | 127 | 0 | 1 | 3 | 5 | 7 | 16 | 24 | 0 | 2 | 6 | 3 | 3 | 2 | 0 | 0 | 1 | 0 | 0 | |
| 7 | 133 | 171 | 123 | 175 | 1 | 3 | 5 | 7 | 9 | 25 | 0 | 19 | 0 | 9 | 0 | 0 | 0 | 3 | 0 | 1 | 0 | 0 | |
| 8 | 133 | 171 | 175 | 123 | 1 | 3 | 5 | 7 | 9 | 25 | 0 | 19 | 0 | 9 | 0 | 0 | 0 | 3 | 0 | 1 | 0 | 0 | |
| 9 | 133 | 171 | 117 | 165 | 1 | 3 | 5 | 7 | 9 | 25 | 0 | 20 | 0 | 7 | 0 | 2 | 0 | 1 | 0 | 2 | 0 | 0 | 6.42e-2 @ 102 |
| 10 | 133 | 171 | 165 | 117 | 1 | 3 | 5 | 7 | 9 | 25 | 0 | 20 | 0 | 7 | 0 | 2 | 0 | 1 | 0 | 2 | 0 | 0 | |
| 11 | 133 | 171 | 145 | 175 | 1 | 3 | 5 | 7 | 10 | 26 | 0 | 19 | 0 | 8 | 0 | 0 | 0 | 2 | 0 | 1 | 0 | 1 | |
| 12 | 133 | 171 | 175 | 145 | 1 | 3 | 5 | 7 | 10 | 26 | 0 | 19 | 0 | 8 | 0 | 0 | 0 | 2 | 0 | 1 | 0 | 1 | |
| 13 | 133 | 171 | 135 | 165 | 1 | 2 | 5 | 8 | 11 | 27 | 0 | 17 | 0 | 6 | 0 | 3 | 0 | 3 | 0 | 1 | 0 | 0 | |
| 14 | 133 | 171 | 165 | 135 | 1 | 2 | 5 | 8 | 11 | 27 | 0 | 17 | 0 | 6 | 0 | 3 | 0 | 3 | 0 | 1 | 0 | 0 | |
| 15 | 133 | 171 | 137 | 151 | 1 | 3 | 5 | 8 | 11 | 28 | 0 | 15 | 0 | 7 | 0 | 5 | 0 | 1 | 0 | 0 | 0 | 1 | |
| 16 | 133 | 171 | 151 | 137 | 1 | 3 | 5 | 8 | 11 | 28 | 0 | 15 | 0 | 7 | 0 | 5 | 0 | 1 | 0 | 0 | 0 | 1 | |
| 17 | 133 | 171 | 117 | 135 | 1 | 3 | 5 | 8 | 11 | 28 | 0 | 16 | 0 | 6 | 0 | 3 | 0 | 3 | 0 | 1 | 0 | 0 | |
| 18 | 133 | 171 | 125 | 157 | 1 | 2 | 5 | 8 | 12 | 28 | 0 | 16 | 0 | 5 | 0 | 5 | 0 | 2 | 0 | 0 | 0 | 1 | |
| 19 | 133 | 171 | 135 | 117 | 1 | 3 | 5 | 8 | 11 | 28 | 0 | 16 | 0 | 6 | 0 | 3 | 0 | 3 | 0 | 1 | 0 | 0 | |
| 20 | 133 | 171 | 157 | 125 | 1 | 2 | 5 | 8 | 12 | 28 | 0 | 16 | 0 | 5 | 0 | 5 | 0 | 2 | 0 | 0 | 0 | 1 | |
| 21 | 133 | 171 | 115 | 137 | 1 | 3 | 5 | 8 | 11 | 28 | 0 | 17 | 0 | 3 | 0 | 6 | 0 | 2 | 0 | 1 | 0 | 0 | |
| 22 | 133 | 171 | 115 | 175 | 1 | 3 | 5 | 8 | 11 | 28 | 0 | 17 | 0 | 3 | 0 | 6 | 0 | 2 | 0 | 1 | 0 | 0 | |
| 23 | 133 | 171 | 125 | 173 | 1 | 2 | 5 | 8 | 12 | 28 | 0 | 17 | 0 | 5 | 0 | 3 | 0 | 2 | 0 | 1 | 0 | 1 | |
| 24 | 133 | 171 | 137 | 115 | 1 | 3 | 5 | 8 | 11 | 28 | 0 | 17 | 0 | 3 | 0 | 6 | 0 | 2 | 0 | 1 | 0 | 0 | |
| 25 | 133 | 171 | 173 | 125 | 1 | 2 | 5 | 8 | 12 | 28 | 0 | 17 | 0 | 5 | 0 | 3 | 0 | 2 | 0 | 1 | 0 | 1 | |
| 26 | 133 | 171 | 175 | 115 | 1 | 3 | 5 | 8 | 11 | 28 | 0 | 17 | 0 | 3 | 0 | 6 | 0 | 2 | 0 | 1 | 0 | 0 | |
| 27 | 133 | 171 | 123 | 137 | 1 | 3 | 5 | 8 | 11 | 28 | 0 | 19 | 0 | 3 | 0 | 0 | 0 | 6 | 0 | 1 | 0 | 0 | |
| 28 | 133 | 171 | 137 | 123 | 1 | 3 | 5 | 8 | 11 | 28 | 0 | 19 | 0 | 3 | 0 | 0 | 0 | 6 | 0 | 1 | 0 | 0 | |
| 29 | 133 | 171 | 137 | 145 | 1 | 3 | 5 | 8 | 11 | 28 | 0 | 19 | 0 | 3 | 0 | 0 | 0 | 6 | 0 | 1 | 0 | 0 | |
| 30 | 133 | 171 | 145 | 137 | 1 | 3 | 5 | 8 | 11 | 28 | 0 | 19 | 0 | 3 | 0 | 0 | 0 | 6 | 0 | 1 | 0 | 0 | |
| 31 | 133 | 171 | 113 | 175 | 1 | 3 | 5 | 8 | 12 | 29 | 0 | 15 | 0 | 5 | 0 | 5 | 0 | 2 | 0 | 0 | 0 | 1 | |
| 32 | 133 | 171 | 151 | 175 | 1 | 3 | 5 | 8 | 12 | 29 | 0 | 15 | 0 | 5 | 0 | 5 | 0 | 2 | 0 | 0 | 0 | 1 | |
| 33 | 133 | 171 | 175 | 113 | 1 | 3 | 5 | 8 | 12 | 29 | 0 | 15 | 0 | 5 | 0 | 5 | 0 | 2 | 0 | 0 | 0 | 1 | |
| 34 | 133 | 171 | 175 | 151 | 1 | 3 | 5 | 8 | 12 | 29 | 0 | 15 | 0 | 5 | 0 | 5 | 0 | 2 | 0 | 0 | 0 | 1 | |
| 35 | 133 | 171 | 135 | 171 | 1 | 3 | 5 | 8 | 12 | 29 | 0 | 16 | 0 | 4 | 0 | 3 | 0 | 4 | 0 | 1 | 0 | 0 | |
| 36 | 133 | 171 | 171 | 135 | 1 | 3 | 5 | 8 | 12 | 29 | 0 | 16 | 0 | 4 | 0 | 3 | 0 | 4 | 0 | 1 | 0 | 0 | |
| 37 | 133 | 171 | 127 | 165 | 1 | 2 | 5 | 9 | 13 | 30 | 0 | 10 | 0 | 9 | 0 | 5 | 0 | 3 | 0 | 0 | 0 | 0 | |
| 38 | 133 | 171 | 165 | 127 | 1 | 2 | 5 | 9 | 13 | 30 | 0 | 10 | 0 | 9 | 0 | 5 | 0 | 3 | 0 | 0 | 0 | 0 | |
| 39 | 133 | 171 | 125 | 167 | 1 | 2 | 5 | 9 | 13 | 30 | 0 | 12 | 0 | 6 | 0 | 6 | 0 | 2 | 0 | 1 | 0 | 0 | |
| 40 | 133 | 171 | 167 | 125 | 1 | 2 | 5 | 9 | 13 | 30 | 0 | 12 | 0 | 6 | 0 | 6 | 0 | 2 | 0 | 1 | 0 | 0 | |
| 41 | 133 | 171 | 135 | 135 | 1 | 2 | 5 | 9 | 13 | 30 | 0 | 15 | 0 | 5 | 0 | 0 | 0 | 6 | 0 | 0 | 0 | 1 | |
| 42 | 133 | 171 | 115 | 167 | 1 | 3 | 6 | 9 | 12 | 31 | 0 | 9 | 0 | 8 | 0 | 7 | 0 | 2 | 0 | 0 | 0 | 0 | |
| 43 | 133 | 171 | 167 | 115 | 1 | 3 | 6 | 9 | 12 | 31 | 0 | 9 | 0 | 8 | 0 | 7 | 0 | 2 | 0 | 0 | 0 | 0 | |
| 44 | 133 | 171 | 147 | 165 | 1 | 3 | 6 | 9 | 12 | 31 | 0 | 10 | 0 | 8 | 0 | 5 | 0 | 2 | 0 | 1 | 0 | 0 | |
| 45 | 133 | 171 | 151 | 167 | 1 | 3 | 6 | 9 | 12 | 31 | 0 | 10 | 0 | 8 | 0 | 5 | 0 | 2 | 0 | 1 | 0 | 0 | |
| 46 | 133 | 171 | 163 | 165 | 1 | 3 | 6 | 9 | 12 | 31 | 0 | 10 | 0 | 8 | 0 | 5 | 0 | 2 | 0 | 1 | 0 | 0 | |
| 47 | 133 | 171 | 165 | 147 | 1 | 3 | 6 | 9 | 12 | 31 | 0 | 10 | 0 | 8 | 0 | 5 | 0 | 2 | 0 | 1 | 0 | 0 | |
| 48 | 133 | 171 | 165 | 163 | 1 | 3 | 6 | 9 | 12 | 31 | 0 | 10 | 0 | 8 | 0 | 5 | 0 | 2 | 0 | 1 | 0 | 0 | |
| 49 | 133 | 171 | 165 | 165 | 1 | 2 | 5 | 9 | 14 | 31 | 0 | 10 | 0 | 8 | 0 | 5 | 0 | 2 | 0 | 0 | 0 | 1 | |
| 50 | 133 | 171 | 167 | 151 | 1 | 3 | 6 | 9 | 12 | 31 | 0 | 10 | 0 | 8 | 0 | 5 | 0 | 2 | 0 | 1 | 0 | 0 | |

TABLE 1-continued

Simulation Results

| INDEX | Generator (K = 7) | | | | # of paths w/ d_free = 20 at different trace length | | | | | # of paths @ different d_free | | | | | | | | | | | | | BER @ SNR = 0 dB (ber @ err cnt) |
|---|---|---|---|---|---|---|---|---|---|---|---|---|---|---|---|---|---|---|---|---|---|---|---|---|
| | | | | | 7 | 8 | 9 | 10 | 11 | 20 | 21 | 22 | 23 | 24 | 25 | 26 | 27 | 28 | 29 | 30 | 31 | 32 | |
| 51 | 133 | 171 | 117 | 153 | 1 | 3 | 6 | 9 | 12 | 31 | 0 | 11 | 0 | 8 | 0 | 4 | 0 | 1 | 0 | 1 | 0 | 1 | |
| 52 | 133 | 171 | 123 | 157 | 1 | 3 | 6 | 9 | 12 | 31 | 0 | 11 | 0 | 7 | 0 | 4 | 0 | 3 | 0 | 1 | 0 | 0 | |
| 53 | 133 | 171 | 123 | 173 | 1 | 3 | 6 | 9 | 12 | 31 | 0 | 11 | 0 | 8 | 0 | 4 | 0 | 1 | 0 | 1 | 0 | 1 | |
| 54 | 133 | 171 | 145 | 157 | 1 | 3 | 6 | 9 | 12 | 31 | 0 | 11 | 0 | 8 | 0 | 4 | 0 | 1 | 0 | 1 | 0 | 1 | |
| 55 | 133 | 171 | 153 | 117 | 1 | 3 | 6 | 9 | 12 | 31 | 0 | 11 | 0 | 8 | 0 | 4 | 0 | 1 | 0 | 1 | 0 | 1 | |
| 56 | 133 | 171 | 157 | 123 | 1 | 3 | 6 | 9 | 12 | 31 | 0 | 11 | 0 | 7 | 0 | 4 | 0 | 3 | 0 | 1 | 0 | 0 | |
| 57 | 133 | 171 | 157 | 145 | 1 | 3 | 6 | 9 | 12 | 31 | 0 | 11 | 0 | 8 | 0 | 4 | 0 | 1 | 0 | 1 | 0 | 1 | |
| 58 | 133 | 171 | 173 | 123 | 1 | 3 | 6 | 9 | 12 | 31 | 0 | 11 | 0 | 8 | 0 | 4 | 0 | 1 | 0 | 1 | 0 | 1 | |
| 59 | 133 | 171 | 145 | 173 | 1 | 3 | 6 | 9 | 13 | 32 | 0 | 11 | 0 | 6 | 0 | 4 | 0 | 2 | 0 | 1 | 0 | 1 | |
| 60 | 133 | 171 | 173 | 145 | 1 | 3 | 6 | 9 | 13 | 32 | 0 | 11 | 0 | 6 | 0 | 4 | 0 | 2 | 0 | 1 | 0 | 1 | |
| 61 | 133 | 171 | 123 | 167 | 1 | 3 | 6 | 10 | 14 | 34 | 0 | 0 | 0 | 19 | 0 | 0 | 0 | 4 | 0 | 0 | 0 | 0 | |
| 62 | 133 | 171 | 135 | 147 | 1 | 3 | 6 | 10 | 14 | 34 | 0 | 0 | 0 | 19 | 0 | 0 | 0 | 4 | 0 | 0 | 0 | 0 | |
| 63 | 133 | 171 | 135 | 163 | 1 | 3 | 6 | 10 | 14 | 34 | 0 | 0 | 0 | 19 | 0 | 0 | 0 | 4 | 0 | 0 | 0 | 0 | |
| 64 | 133 | 171 | 145 | 167 | 1 | 3 | 6 | 10 | 14 | 34 | 0 | 0 | 0 | 20 | 0 | 0 | 0 | 2 | 0 | 0 | 0 | 1 | |
| 65 | 133 | 171 | 147 | 135 | 1 | 3 | 6 | 10 | 14 | 34 | 0 | 0 | 0 | 19 | 0 | 0 | 0 | 4 | 0 | 0 | 0 | 0 | |
| 66 | 133 | 171 | 163 | 135 | 1 | 3 | 6 | 10 | 14 | 34 | 0 | 0 | 0 | 19 | 0 | 0 | 0 | 4 | 0 | 0 | 0 | 0 | |
| 67 | 133 | 171 | 167 | 123 | 1 | 3 | 6 | 10 | 14 | 34 | 0 | 0 | 0 | 19 | 0 | 0 | 0 | 4 | 0 | 0 | 0 | 0 | |
| 68 | 133 | 171 | 167 | 145 | 1 | 3 | 6 | 10 | 14 | 34 | 0 | 0 | 0 | 20 | 0 | 0 | 0 | 2 | 0 | 0 | 0 | 1 | |
| 69 | 133 | 171 | 115 | 157 | 1 | 3 | 6 | 10 | 14 | 34 | 0 | 2 | 0 | 15 | 0 | 4 | 0 | 0 | 0 | 2 | 0 | 0 | |
| 70 | 133 | 171 | 115 | 173 | 1 | 3 | 6 | 10 | 14 | 34 | 0 | 2 | 0 | 15 | 0 | 4 | 0 | 0 | 0 | 2 | 0 | 0 | |
| 71 | 133 | 171 | 157 | 115 | 1 | 3 | 6 | 10 | 14 | 34 | 0 | 2 | 0 | 15 | 0 | 4 | 0 | 0 | 0 | 2 | 0 | 0 | |
| 72 | 133 | 171 | 173 | 115 | 1 | 3 | 6 | 10 | 14 | 34 | 0 | 2 | 0 | 15 | 0 | 4 | 0 | 0 | 0 | 2 | 0 | 0 | |
| 73 | 133 | 171 | 117 | 155 | 1 | 3 | 6 | 10 | 15 | 35 | 0 | 0 | 0 | 18 | 0 | 0 | 0 | 3 | 0 | 0 | 0 | 1 | |
| 74 | 133 | 171 | 151 | 173 | 1 | 3 | 6 | 10 | 15 | 35 | 0 | 0 | 0 | 18 | 0 | 0 | 0 | 3 | 0 | 0 | 0 | 1 | |
| 75 | 133 | 171 | 155 | 117 | 1 | 3 | 6 | 10 | 15 | 35 | 0 | 0 | 0 | 18 | 0 | 0 | 0 | 3 | 0 | 0 | 0 | 1 | |
| 76 | 133 | 171 | 173 | 151 | 1 | 3 | 6 | 10 | 15 | 35 | 0 | 0 | 0 | 18 | 0 | 0 | 0 | 3 | 0 | 0 | 0 | 1 | |
| 77 | 133 | 171 | 155 | 171 | 1 | 3 | 6 | 10 | 16 | 36 | 0 | 0 | 0 | 17 | 0 | 0 | 0 | 2 | 0 | 0 | 0 | 2 | |
| 78 | 133 | 171 | 171 | 155 | 1 | 3 | 6 | 10 | 16 | 36 | 0 | 0 | 0 | 17 | 0 | 0 | 0 | 2 | 0 | 0 | 0 | 2 | |
| 79 | 133 | 171 | 113 | 157 | 1 | 3 | 6 | 11 | 16 | 37 | 0 | 0 | 0 | 14 | 0 | 0 | 0 | 5 | 0 | 0 | 0 | 1 | |
| 80 | 133 | 171 | 157 | 113 | 1 | 3 | 6 | 11 | 16 | 37 | 0 | 0 | 0 | 14 | 0 | 0 | 0 | 5 | 0 | 0 | 0 | 1 | |
| 81 | 133 | 171 | 65 | 137 | 1 | 3 | 7 | 11 | 15 | 37 | 0 | 10 | 0 | 3 | 0 | 5 | 0 | 1 | 0 | 1 | 0 | 0 | |
| 82 | 133 | 171 | 137 | 65 | 1 | 3 | 7 | 11 | 15 | 37 | 0 | 10 | 0 | 3 | 0 | 5 | 0 | 1 | 0 | 1 | 0 | 0 | |
| 83 | 133 | 171 | 137 | 152 | 1 | 3 | 7 | 11 | 15 | 37 | 0 | 10 | 0 | 3 | 0 | 5 | 0 | 1 | 0 | 1 | 0 | 0 | |
| 84 | 133 | 171 | 152 | 137 | 1 | 3 | 7 | 11 | 15 | 37 | 0 | 10 | 0 | 3 | 0 | 5 | 0 | 1 | 0 | 1 | 0 | 0 | |
| 85 | 133 | 171 | 113 | 173 | 1 | 3 | 6 | 11 | 17 | 38 | 0 | 0 | 0 | 13 | 0 | 0 | 0 | 4 | 0 | 0 | 0 | 2 | |
| 86 | 133 | 171 | 117 | 133 | 1 | 3 | 6 | 11 | 17 | 38 | 0 | 0 | 0 | 13 | 0 | 0 | 0 | 4 | 0 | 0 | 0 | 2 | |
| 87 | 133 | 171 | 133 | 117 | 1 | 3 | 6 | 11 | 17 | 38 | 0 | 0 | 0 | 13 | 0 | 0 | 0 | 4 | 0 | 0 | 0 | 2 | |
| 88 | 133 | 171 | 173 | 113 | 1 | 3 | 6 | 11 | 17 | 38 | 0 | 0 | 0 | 13 | 0 | 0 | 0 | 4 | 0 | 0 | 0 | 2 | |
| 89 | 133 | 171 | 53 | 175 | 1 | 3 | 7 | 11 | 16 | 38 | 0 | 10 | 0 | 1 | 0 | 5 | 0 | 2 | 0 | 1 | 0 | 0 | |
| 90 | 133 | 171 | 65 | 175 | 1 | 3 | 7 | 11 | 16 | 38 | 0 | 10 | 0 | 1 | 0 | 5 | 0 | 2 | 0 | 1 | 0 | 0 | |
| 91 | 133 | 171 | 75 | 135 | 1 | 3 | 7 | 11 | 16 | 38 | 0 | 10 | 0 | 2 | 0 | 4 | 0 | 1 | 0 | 2 | 0 | 0 | |
| 92 | 133 | 171 | 126 | 175 | 1 | 3 | 7 | 11 | 16 | 38 | 0 | 10 | 0 | 1 | 0 | 5 | 0 | 2 | 0 | 1 | 0 | 0 | |
| 93 | 133 | 171 | 135 | 75 | 1 | 3 | 7 | 11 | 16 | 38 | 0 | 10 | 0 | 2 | 0 | 4 | 0 | 1 | 0 | 2 | 0 | 0 | |
| 94 | 133 | 171 | 135 | 172 | 1 | 3 | 7 | 11 | 16 | 38 | 0 | 10 | 0 | 2 | 0 | 4 | 0 | 1 | 0 | 2 | 0 | 0 | |
| 95 | 133 | 171 | 152 | 175 | 1 | 3 | 7 | 11 | 16 | 38 | 0 | 10 | 0 | 1 | 0 | 5 | 0 | 2 | 0 | 1 | 0 | 0 | |
| 96 | 133 | 171 | 172 | 135 | 1 | 3 | 7 | 11 | 16 | 38 | 0 | 10 | 0 | 2 | 0 | 4 | 0 | 1 | 0 | 2 | 0 | 0 | |
| 97 | 133 | 171 | 175 | 53 | 1 | 3 | 7 | 11 | 16 | 38 | 0 | 10 | 0 | 1 | 0 | 5 | 0 | 2 | 0 | 1 | 0 | 0 | |
| 98 | 133 | 171 | 175 | 65 | 1 | 3 | 7 | 11 | 16 | 38 | 0 | 10 | 0 | 1 | 0 | 5 | 0 | 2 | 0 | 1 | 0 | 0 | |
| 99 | 133 | 171 | 175 | 126 | 1 | 3 | 7 | 11 | 16 | 38 | 0 | 10 | 0 | 1 | 0 | 5 | 0 | 2 | 0 | 1 | 0 | 0 | |
| 100 | 133 | 171 | 175 | 152 | 1 | 3 | 7 | 11 | 16 | 38 | 0 | 10 | 0 | 1 | 0 | 5 | 0 | 2 | 0 | 1 | 0 | 0 | |
| 101 | 135 | 135 | 147 | 163 | 1 | 3 | 6 | 11 | 18 | 39 | 0 | 0 | 0 | 10 | 0 | 0 | 0 | 7 | 0 | 0 | 0 | 1 | 2.6e−4 @ 108 |
| 102 | 133 | 171 | 133 | 171 | 1 | 3 | 6 | 11 | 18 | 39 | 0 | 0 | 0 | 10 | 0 | 0 | 0 | 7 | 0 | 0 | 0 | 1 | |
| 103 | 133 | 171 | 171 | 133 | 1 | 3 | 6 | 11 | 18 | 39 | 0 | 0 | 0 | 10 | 0 | 0 | 0 | 7 | 0 | 0 | 0 | 1 | |
| 104 | 133 | 171 | 57 | 165 | 1 | 3 | 7 | 12 | 17 | 40 | 0 | 2 | 0 | 9 | 0 | 5 | 0 | 0 | 0 | 1 | 0 | 0 | |
| 105 | 133 | 171 | 75 | 127 | 1 | 3 | 7 | 12 | 17 | 40 | 0 | 2 | 0 | 9 | 0 | 5 | 0 | 0 | 0 | 1 | 0 | 0 | |
| 106 | 133 | 171 | 127 | 75 | 1 | 3 | 7 | 12 | 17 | 40 | 0 | 2 | 0 | 9 | 0 | 5 | 0 | 0 | 0 | 1 | 0 | 0 | |
| 107 | 133 | 171 | 127 | 172 | 1 | 3 | 7 | 12 | 17 | 40 | 0 | 2 | 0 | 9 | 0 | 5 | 0 | 0 | 0 | 1 | 0 | 0 | |
| 108 | 133 | 171 | 136 | 165 | 1 | 3 | 7 | 12 | 17 | 40 | 0 | 2 | 0 | 9 | 0 | 5 | 0 | 0 | 0 | 1 | 0 | 0 | |
| 109 | 133 | 171 | 165 | 57 | 1 | 3 | 7 | 12 | 17 | 40 | 0 | 2 | 0 | 9 | 0 | 5 | 0 | 0 | 0 | 1 | 0 | 0 | |
| 110 | 133 | 171 | 165 | 136 | 1 | 3 | 7 | 12 | 17 | 40 | 0 | 2 | 0 | 9 | 0 | 5 | 0 | 0 | 0 | 1 | 0 | 0 | |
| 111 | 133 | 171 | 172 | 127 | 1 | 3 | 7 | 12 | 17 | 40 | 0 | 2 | 0 | 9 | 0 | 5 | 0 | 0 | 0 | 1 | 0 | 0 | |
| 112 | 133 | 171 | 55 | 175 | 1 | 3 | 7 | 12 | 19 | 42 | 0 | 0 | 0 | 11 | 0 | 0 | 0 | 3 | 0 | 0 | 0 | 1 | |
| 113 | 133 | 171 | 132 | 175 | 1 | 3 | 7 | 12 | 19 | 42 | 0 | 0 | 0 | 11 | 0 | 0 | 0 | 3 | 0 | 0 | 0 | 1 | |
| 114 | 133 | 171 | 175 | 55 | 1 | 3 | 7 | 12 | 19 | 42 | 0 | 0 | 0 | 11 | 0 | 0 | 0 | 3 | 0 | 0 | 0 | 1 | |
| 115 | 133 | 171 | 175 | 132 | 1 | 3 | 7 | 12 | 19 | 42 | 0 | 0 | 0 | 11 | 0 | 0 | 0 | 3 | 0 | 0 | 0 | 1 | |
| 116 | 133 | 171 | 55 | 137 | 1 | 3 | 7 | 13 | 20 | 44 | 0 | 0 | 0 | 7 | 0 | 0 | 0 | 5 | 0 | 0 | 0 | 1 | |

TABLE 1-continued

Simulation Results

| INDEX | Generator (K = 7) | | | | # of paths w/ d_free = 20 at different trace length | | | | | # of paths @ different d_free | | | | | | | | | | | | | BER @ SNR = 0 dB (ber @ err cnt) |
|---|---|---|---|---|---|---|---|---|---|---|---|---|---|---|---|---|---|---|---|---|---|---|---|
| | | | | | 7 | 8 | 9 | 10 | 11 | 20 | 21 | 22 | 23 | 24 | 25 | 26 | 27 | 28 | 29 | 30 | 31 | 32 | |
| 117 | 133 | 171 | 132 | 137 | 1 | 3 | 7 | 13 | 20 | 44 | 0 | 0 | 0 | 7 | 0 | 0 | 0 | 5 | 0 | 0 | 0 | 1 | |
| 118 | 133 | 171 | 137 | 55 | 1 | 3 | 7 | 13 | 20 | 44 | 0 | 0 | 0 | 7 | 0 | 0 | 0 | 5 | 0 | 0 | 0 | 1 | |
| 119 | 133 | 171 | 137 | 132 | 1 | 3 | 7 | 13 | 20 | 44 | 0 | 0 | 0 | 7 | 0 | 0 | 0 | 5 | 0 | 0 | 0 | 1 | 1.37e−4 @ 113 |

At step 210, there is a finding of a set of codes (Set A) that have the maximal-minimal free distance. In other words, for example, the algorithm searches the free distances of all codes having the generators of (133,171), and is not catastrophic, by going through all of the possible combinations. Of all the free distances for each code, the minimum free distance, $d_{min,free}$, is found for each code.

Table 1, supra, shows 119 codes that have the maximal $d_{min,free}=20$. The free distance represents the error correcting capability of the code. The maximal minimal free distance is the minimal distance between any two codeword sequences having the same number of bits. Thus, in this particular case there are 119 codes found that have a free distance of 20.

At step 220, a set of codes (subset of A) is found from (Set A) that have the smallest number of paths at the free distance 20. In this particular case, 6 codes were found that have a total number of 16 paths, as shown for index numbers 1-6 and going across to the column with a "20" distance, each index# has a quantity of 16 in the free distance quantity of 20 free paths each. The quantity 16 is further analyzed by looking at the trace length from 7 to 11, and it turns out they all have the same characteristics 0, 1, 3, 5, 7. It should be noted that the trace length is equivalent to the number of inputs. In other words, there is no output sequence that has d_free=20 for 7 input bits; there is 1 sequence that has d_free=20 for 8 input bits, and 3 sequences having d_free=20 for 9 input bits; etc.

At step 230, the code having the smallest number of paths at free distance 21, 22, 23 is selected. Since all 6 codes have the same number 16, we compare the next one-21. Codes 1 and 2 only have 22 while codes 3-6 have 24. The codes 1,2, which are equivalent, are selected. In this particular example, the selection of (133, 171, 135, 175) is considered to be the best candidate for the extended convolution codes of (133, 171) at the ¼ rate.

At step 240 (which is not shown in FIG. 2 as it is optional), the code's performance is verified at the rate of ⅓. We go through the same steps for the rate of ⅓ and, in this case, (133, 171, 135) happens to be the best code with the best known free distance of 15 as shown in boldface in the worksheet in Table 2.

TABLE 2

| 1st Code | 2nd Code | ⅓ CC | Free Distance |
|---|---|---|---|
| 133 | 171 | 1 | 11 |
| 133 | 171 | 2 | 11 |
| 133 | 171 | 3 | 12 |
| 133 | 171 | 4 | 11 |
| 133 | 171 | 5 | 12 |
| 133 | 171 | 6 | 12 |
| 133 | 171 | 7 | 12 |

TABLE 2-continued

| 1st Code | 2nd Code | ⅓ CC | Free Distance |
|---|---|---|---|
| 133 | 171 | 10 | 11 |
| 133 | 171 | 11 | 12 |
| 133 | 171 | 12 | 12 |
| 133 | 171 | 13 | 13 |
| 133 | 171 | 14 | 12 |
| 133 | 171 | 15 | 13 |
| 133 | 171 | 16 | 12 |
| 133 | 171 | 17 | 12 |
| 133 | 171 | 20 | 11 |
| 133 | 171 | 21 | 12 |
| 133 | 171 | 22 | 12 |
| 133 | 171 | 23 | 13 |
| 133 | 171 | 24 | 12 |
| 133 | 171 | 25 | 13 |
| 133 | 171 | 26 | 13 |
| 133 | 171 | 27 | 12 |
| 133 | 171 | 30 | 12 |
| 133 | 171 | 31 | 13 |
| 133 | 171 | 32 | 13 |
| 133 | 171 | 33 | 12 |
| 133 | 171 | 34 | 12 |
| 133 | 171 | 35 | 14 |
| 133 | 171 | 36 | 12 |
| 133 | 171 | 37 | 12 |
| 133 | 171 | 40 | 11 |
| 133 | 171 | 41 | 12 |
| 133 | 171 | 42 | 12 |
| 133 | 171 | 43 | 13 |
| 133 | 171 | 44 | 12 |
| 133 | 171 | 45 | 13 |
| 133 | 171 | 46 | 13 |
| 133 | 171 | 47 | 14 |
| 133 | 171 | 50 | 12 |
| 133 | 171 | 51 | 13 |
| 133 | 171 | 52 | 13 |
| 133 | 171 | 53 | 14 |
| 133 | 171 | 54 | 13 |
| 133 | 171 | 55 | 14 |
| 133 | 171 | 56 | 12 |
| 133 | 171 | 57 | 13 |
| 133 | 171 | 60 | 12 |
| 133 | 171 | 61 | 13 |
| 133 | 171 | 62 | 13 |
| 133 | 171 | 63 | 14 |
| 133 | 171 | 64 | 13 |
| 133 | 171 | 65 | 14 |
| 133 | 171 | 66 | 12 |
| 133 | 171 | 67 | 13 |
| 133 | 171 | 70 | 12 |
| 133 | 171 | 71 | 14 |
| 133 | 171 | 72 | 14 |
| 133 | 171 | 73 | 13 |
| 133 | 171 | 74 | 12 |
| 133 | 171 | 75 | 13 |
| 133 | 171 | 76 | 12 |
| 133 | 171 | 77 | 12 |
| 133 | 171 | 100 | 11 |
| 133 | 171 | 101 | 12 |

TABLE 2-continued

| 1st Code | 2nd Code | ⅓ CC | Free Distance |
|---|---|---|---|
| 133 | 171 | 102 | 12 |
| 133 | 171 | 103 | 13 |
| 133 | 171 | 104 | 12 |
| 133 | 171 | 105 | 13 |
| 133 | 171 | 106 | 13 |
| 133 | 171 | 107 | 14 |
| 133 | 171 | 110 | 12 |
| 133 | 171 | 111 | 12 |
| 133 | 171 | 112 | 13 |
| 133 | 171 | 113 | 14 |
| 133 | 171 | 114 | 13 |
| 133 | 171 | 115 | 14 |
| 133 | 171 | 116 | 14 |
| 133 | 171 | 117 | 14 |
| 133 | 171 | 120 | 12 |
| 133 | 171 | 121 | 13 |
| 133 | 171 | 122 | 13 |
| 133 | 171 | 123 | 14 |
| 133 | 171 | 124 | 13 |
| 133 | 171 | 125 | 14 |
| 133 | 171 | 126 | 14 |
| 133 | 171 | 127 | 13 |
| 133 | 171 | 130 | 13 |
| 133 | 171 | 131 | 14 |
| 133 | 171 | 132 | 14 |
| 133 | 171 | 133 | 13 |
| 133 | 171 | 134 | 12 |
| 133 | 171 | 135 | 15 |
| 133 | 171 | 136 | 13 |
| 133 | 171 | 137 | 14 |
| 133 | 171 | 140 | 12 |
| 133 | 171 | 141 | 13 |
| 133 | 171 | 142 | 13 |
| 133 | 171 | 143 | 14 |
| 133 | 171 | 144 | 13 |
| 133 | 171 | 145 | 14 |
| 133 | 171 | 146 | 14 |
| 133 | 171 | 147 | 14 |
| 133 | 171 | 150 | 13 |
| 133 | 171 | 151 | 14 |
| 133 | 171 | 152 | 14 |
| 133 | 171 | 153 | 13 |
| 133 | 171 | 154 | 12 |
| 133 | 171 | 155 | 13 |
| 133 | 171 | 156 | 13 |
| 133 | 171 | 157 | 14 |
| 133 | 171 | 160 | 12 |
| 133 | 171 | 161 | 14 |
| 133 | 171 | 162 | 14 |
| 133 | 171 | 163 | 14 |
| 133 | 171 | 164 | 14 |
| 133 | 171 | 165 | 15 |
| 133 | 171 | 166 | 13 |
| 133 | 171 | 167 | 14 |
| 133 | 171 | 170 | 12 |
| 133 | 171 | 171 | 13 |
| 133 | 171 | 172 | 13 |
| 133 | 171 | 173 | 14 |
| 133 | 171 | 174 | 12 |
| 133 | 171 | 175 | 14 |
| 133 | 171 | 176 | 12 |
| 133 | 171 | 177 | 12 |

Thus, from steps 210-240 it can be concluded for that particular example, that for the mother code rate of ½, m-7, (133, 171), the best ¼ extended convolutional code is (133, 171, 135, 175) and the best ⅓ code, as punctured from the ¼ code is (133, 171, 135).

Figure 3:
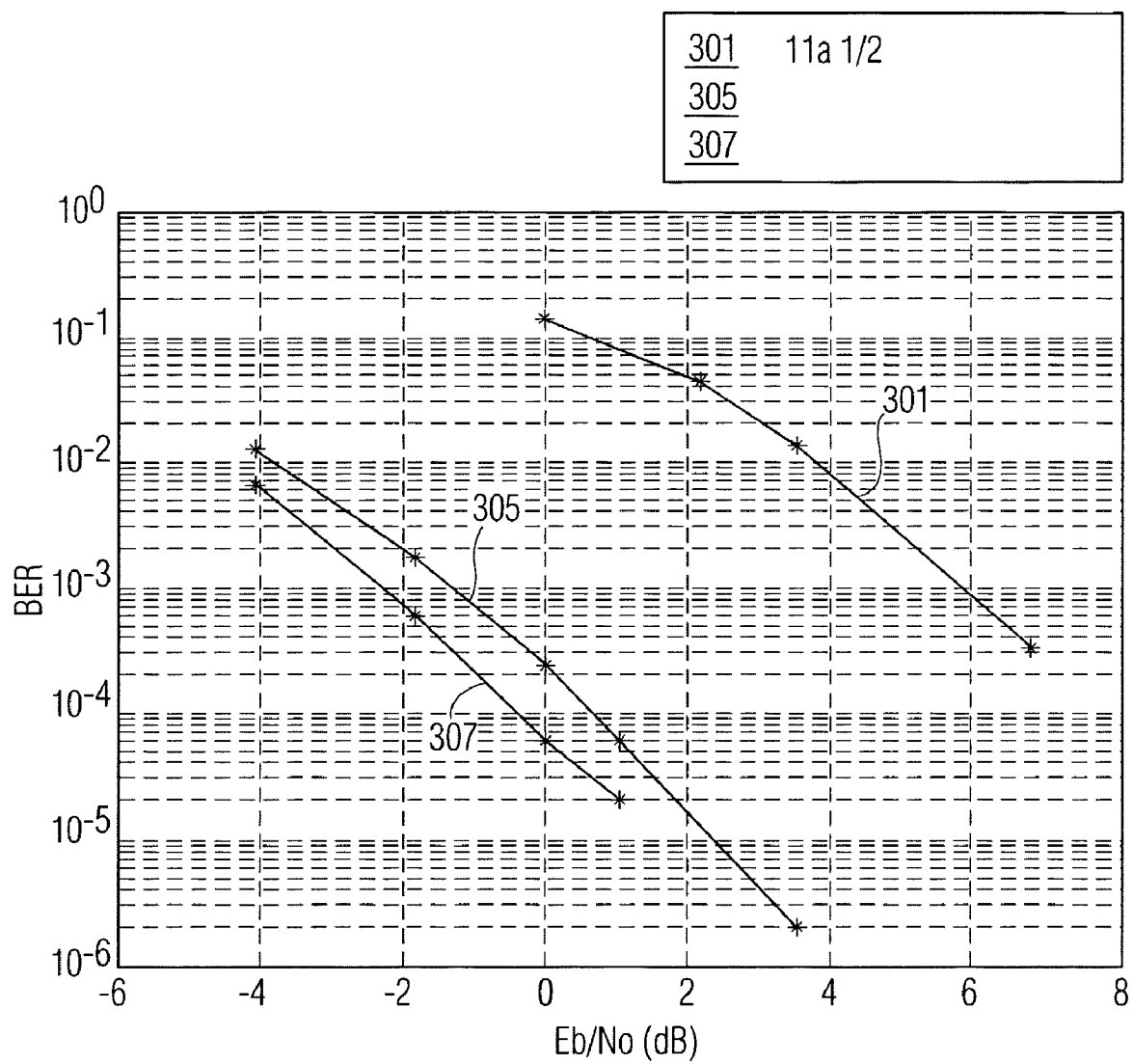
FIG. 3 is a graphical illustration of comparative Bit error rates (BER) for different convolutional encoders.

FIG. 3 provides a graphical illustration comparing the CC at the ½ error rate 301, the standard ¼ rate 305, and the optimal extended ¼ rate 307 according to the present invention. The graph shows that at 0 db the error rate of the optimal extended ¼ rate 307 is significantly smaller than the standard ¼ and ½ rates previously shown. The ratio used is Eb/No, and the comparison of the three items on the graph is particularly shown at 0 db, that the BER is a much smaller number for the optimal extended ¼ rate at 0 db than the standard ¼ rate or the ½ rate shown.

Figure 4:
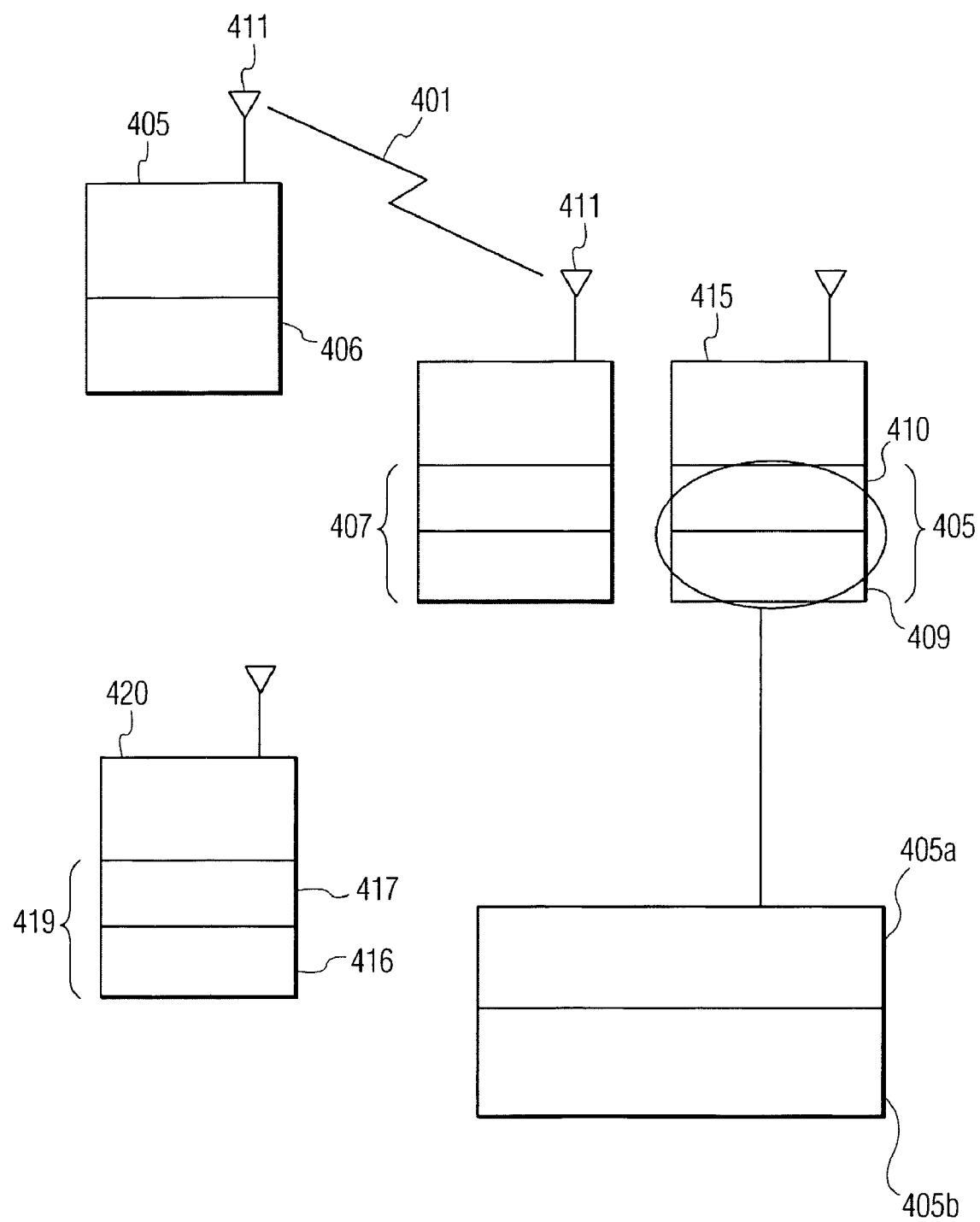
FIG. 4 is an illustration providing detail about one possible arrangement of a system according to the present invention.

FIG. 4 provides an illustration of an extended convolutional coding system and apparatus according to the present invention. In this particular case, there is a wireless network running under a wireless network protocol 401. It could be under 802.11, Bluetooth, ATM, etc., or although not shown in this illustration, the network could be wired such as under 802.3. In the network, the server transmits 405 to and from the clients 410, 415 and 420, typically using packets or frames. These packets or frames could be conventional standardized packets, or new superframes having about 16 packets, as disclosed in the Philips disclosure 779763/4 that is previously referred to in the specification. Both the server and the clients either are in communication therewith, or have within their units, respective encoder/decoder modules 405, 406, 407 and 419. The units would permit, before the transmission of a frame/packet or super frame, modulation and coding, preferably forward error correction, using convolutional coding and decoding.

Reference module 405*a* is a box representation of just such a convolution encoder/decoder module. Reference 405*b*, on the other hand, is a representation of an extended convolutional encoder/decoder module. The extended convolutional encoder/decoder may have additional memory registers, modulo-adders, etc. In any even, as discussed in the example of one way the convolutional code could be extended, it is possible, for example that a mother code rate ½ (133,171) and a constraint length of 7 can be extended to a new rate ¼ CC with (133, 171, 135, 175). In other words, instead of two bits per input, the extended coding can provide 4 bits per input, or a punctured ⅓ rate from the ¼ code is (133, 171, 135) thus drastically improving the Bit Error Rate performance at predetermined SNR values (typically 0 db).

Various modifications to the above invention can be made by persons of ordinary skill in the art that do not depart from the spirit of the invention, or the scope of the appended claims. For example, in no way is the extended convolutional coding limited to ½ and ¼ rates, as it can be used on many other rates that drastically depart from values such as ½ and ¼ rates, (could be, for example ⅛5, ⅞8, etc.) including those that are not mother code rates, and have something other than one input that is not punctured.

The invention claimed is:

1. An extended convolutional encoder device comprising:
    a convolutional encoder module comprising one or more memory registers,
    at least one adder and a delay element; and
    an extended convolutional encoder module that receives a convolutional code and extends the received convolutional code to increase error correction by increasing a number of coded bits per input,
    a transmission unit that wirelessly transmits the received convolutional code via an antenna, wherein the transmission unit transmits a superframe comprising at least 16 packets.

2. The extended convolutional encoder according to claim 1, wherein the at least one adder comprises a modulo-2 adder; and the extended convolutional encoder module includes a code for performing a selection of an extended convolutional code based on the received code.

3. A wireless system having an extended convolutional encoder/decoder therein, comprising:
    a wireless network;
    a server having an extended convolutional encoding/decoding module;

one or more clients, at least one of which performs extended convolutional encoding/decoding; and a wireless transmitter for the server and the one or more clients to communicate via the wireless network, wherein the server and the at least one client transmit a superframe comprising at least 16 packets.

4. The system according to claim 3, wherein the wireless network comprises an IEEE 802.11 wireless network.

5. The system according to claim 3, wherein the wireless network comprises a Bluetooth network.

6. The system according to claim 3, wherein the wireless network comprises a satellite network.

7. The system according to claim 3, wherein the wireless network comprises a broadcast network.

8. The system according to claim 3, wherein the server and the at least one client transmit one or more packets/frames using extended convolutional encoding/decoding.

9. A method of extending convolutional codes, comprising:
retrieving a set of codes from a database, wherein the set of codes has a maximal-minimal free distance-within a range;
selecting a subset of the retrieved set of codes that have a smallest number of paths at the maximal-minimal free distance; and
finding extended convolutional codes by selecting a code having a certain rate from the selected subset of the retrieved set of codes that have the smallest number of paths at increased free distances to provide the best candidates;
providing the extended convolutional codes to an encoder; and
encoding one or more frames/packets if the verified performance meets the threshold value, wherein the encoded frames/packets comprise superframes having at least 16 packets therein.

10. The method according to claim 9, further comprising:
verifying a performance of the extended code at an extended encoding rate that is higher than the certain rate.

11. The method according to claim 10, further comprising:
repeating the retrieving, selecting, and finding steps when the verified performance does not reach a certain threshold value.

12. The method according to claim 11, wherein the threshold value comprises a ratio of Bit Error Rate to a Signal to Noise Ratio, wherein the Signal to Noise Ratio is expressed as $E_b/N_o$.

13. The method according to claim 11, wherein the one or more frames/packets are encoded according to IEEE 802.11 protocol.

14. The method according to claim 11, further comprising:
transmitting the encoded one or more frames/packets over a wireless network to a wireless device; and
said wireless device decoding said encoded one or more frames/packets into frames/packets in their original protocol.

15. The method according to claim 9, further comprising:
coding one or more frames of data using the extended code.

16. The method according to claim 9, wherein the subset of codes comprises mother codes.

* * * * *